United States Patent [19]

Kuwabara et al.

[11] 4,058,777
[45] Nov. 15, 1977

[54] OSCILLATING CIRCUIT

[75] Inventors: Katsutoshi Kuwabara, Yamato; Katsuaki Goto, Settsu, both of Japan

[73] Assignee: Hochiki Corporation, Japan

[21] Appl. No.: 708,683

[22] Filed: July 26, 1976

[30] Foreign Application Priority Data

July 25, 1975 Japan .................................. 50-90055
July 25, 1975 Japan .................................. 50-90056

[51] Int. Cl.² .................... H03K 3/282; H03K 3/353
[52] U.S. Cl. ................................ 331/57; 331/108 D; 331/111
[58] Field of Search .................... 331/57, 111, 113 R, 331/108 D; 307/223 R, 223 C

[56] References Cited

U.S. PATENT DOCUMENTS 3,851,277  11/1974  Suzuki et al. ............... 331/108 D X
3,875,527  4/1975   Garcia ........................ 331/111 X Primary Examiner—Siegfried H. Grimm
Attorney, Agent, or Firm—Robert E. Burns; Emmanuel J. Lobato; Bruce L. Adams

[57] ABSTRACT

An oscillator circuit comprised of three bistable circuits connected in cascade, a circuit for generating first timing signals, and a circuit for generating second timing signals. Output signals from the series of bistable circuits are applied to enable the circuits for generating timing signals, and the timing signals are applied to an input of the series of bistable circuits to change the states of the bistable circuits. After a first time interval has elapsed the first timing signal changes the state of a first bistable circuit which in turn successively changes the states of the other bistable circuits. After a second time interval has elapsed after the changes of state effectuated by the first timing signal, the second timing signal changes the state of the first bistable circuit which in turn successively changes the states of the other bistable circuits, so that the bistable circuits repetitively change state with a period equal to the sum of the first and the second time intervals.

8 Claims, 4 Drawing Figures

OSCILLATING CIRCUIT

BACKGROUND OF THE INVENTION

The present invention relates to an oscillator circuit comprising three inverter stages or bistable circuits connected in cascade, and more particularly to such an oscillator circuit having timing circuitry for controlling the period of oscillations and the duty cycle of the oscillations.

Oscillator circuits are used for energizing smoke sensors in fire detecting systems. A known oscillating circuit for this purpose is disclosed in U.S. Pat. No. 3,773,596. For proper operation this oscillator requires the use of a pair of matched field effect transistors. Moreover, this oscillator does not provide for a simple manner of changing the duty cycle of its output pulse signal in order to meet the accuracy requirements of a particular fire detecting system. It would be desireable to eliminate the requirement for a matched pair of transistors and to be able to easily select output pulse period and duty cycle.

SUMMARY OF THE INVENTION

It is an object of the present invention to provide an oscillator circuit constructed from conventional bistable circuits which does not require matched pairs of components.

It is another object of the invention to provide an oscillator circuit in which the output signal period can be easily set.

It is still another object of the invention to provide an oscillator circuit in which the output signal duty cycle can be easily set.

Still another object of the present invention is provide an oscillator circuit which exhibits a low current dissipation.

The oscillator circuit according to the invention is comprised of first, second and third bistable circuits connected in cascade. Each of the bistable circuits has a pair of stable operating states and each has a respective input port for receiving input signals and a respective output port for developing output signals thereat. The bistable circuits are responsive to input signals applied to their respective input ports for operating in states determined by the input signals and for developing respective output signals having values according to the states of the bistable circuits. Because the bistable circuits are connected in cascade a change of state of the first bistable circuit will effectuate successive changes of state of the second and third bistable circuits so that the output signal of the third bistable circuit is representative of the state of the first bistable circuit.

A first timing circuit is connected to the output port of the third bistable circuit to receive the output signals developed thereat for developing a first timing signal effective to change the state of the first bistable circuit from a first state to a second state after a first time interval has elapsed after the third bistable circuit has changed from a state corresponding to the second state of the first bistable circuit to a state corresponding to the first state of the first bistable circuit, and for applying the first timing signal to the input port of the first bistable circuit. Similarly, a second timing circuit is connected to the output port of the third bistable circuit to receive the output signals developed thereat for developing a second timing signal effective to change the state of the first bistable circuit from the second state to the first state after a second time interval has elapsed after the third bistable circuit has changed from a state corresponding to the first state of the first bistable circuit to a state corresponding to the second state of the first bistable circuit, and for applying the second timing signal to the input port of the first bistable circuit. Consequently, the states of the bistable circuits oscillate between their respective stable operating states with a period equal to the sum of the first time interval and the second time interval. Moreover, the time in which a bistable circuit remains in a certain operating state is determined by a respective one of the timing circuits independently of the other timing circuit so that the duty cycle of the bistable circuit oscillations may be fixed independently from the period of the oscillations.

In the preferred embodiment of the invention each of the bistable circuits comprise a complementary pair of field effect transistors with respective channels of complementary conductivity type, having their respective gates connected together to define an input port for the pair, and having their respective drains connected together to define an output port for the pair. The first timing circuit or timing means comprises a first resistor and a capacitor connected in series between the ouput port of the third bistable circuit and earth for charging the capacitor with an output signal of the third bistable circuit, and means for applying a voltage stored in the capacitor to apply an increasing capacitor voltage as the first timing signal to the input port of the first bistable circuit. The second timing circuit or timing means comprises a second resistor and a diode connected in series across the first resistor with the diode having a polarity effective to define a discharge path for the voltage stored in the capacitor, and the means for applying the voltage stored in the capacitor applies a decreasing capacitor voltage as the second timing signal to the input port of the first bistable circuit. This structure may also include resistors connecting the output ports of the bistable circuits to the corresponding input ports of the next successive bistable circuits.

BRIEF DESCRIPTION OF THE DRAWINGS

Other features and advantages of the oscillator circuit according to the invention will be apparent from the disclosure and appended claims and drawings in which:

DESCRIPTION OF THE PREFERRED EMBODIMENT

Figure 1:
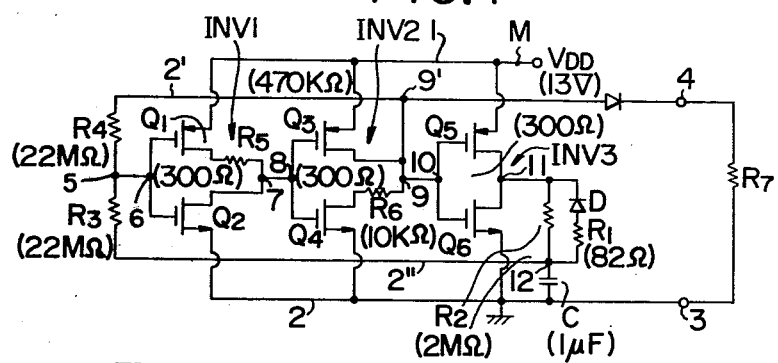
FIG. 1 is a schematic circuit diagram of the oscillator circuit according to the present invention.

The oscillator according to the invention illustrated in FIG. 1 includes an inverter INV1 having a complementary pair of field effect transistors comprised of a P-channel type field effect transistor Q1 and a N-channel type field effect transistor Q2 having their respective drains connected to each other. Similarly, inverters INV2 and INV3 comprise complementary pairs of field effect transistors Q3 and Q4, and field effect transistors Q5 and Q6, respectively. The complementary field effect transistor pairs may have a CMOS structure.

The source-drain path of the transistor Q1 and the drain-source path of the transistor Q2 which together comprise the inverter INV1 are connected in series in a complementary manner between a power supply $V_{DD}$ and the earth. The transistor pairs comprising INV2 and INV3 are similarly connected. The three inverters INV1–INV3 are interconnected as three series stages to apply the output from a preceding stage to the input of a next successive stage. The output of the final stage, INV3, is connected with the gates of the first inverter INV1 transistors through a charging and discharging circuit means or timing means.

The source of each of the transistors Q1, Q3 and Q5 of the respective inverter stages is connected by the supply line 1 to the power source $V_{DD}$. The source of each of the remaining transistors Q2, Q4 and Q6 is connected to the earth line 2. The gate 6 of the first stage inverter INV1 is connected to the earth line 2 through load terminals 3 and 4 by the auxiliary line 2'. Additionally gate 6 is connected to the output node 11 of the final stage inverter INV3 by a control line 2" which is connected to the auxiliary line 2' at the node 5. The output node 7 of the inverter INV1 is connected to the gate 8 of the next inverter INV2, and the output node 9 of the inverter INV2 is connected to the gate 10 of the next inverter INV3. The output node 9 is also connected to the auxiliary line 2' at the node 9'.

The control line 2" includes a resistor R3 connected to the gate 6, and the control line 2" is part of a charging and discharging loop connected to the node 11 of the inverter INV3. This charging and discharging loop comprises a diode D and a resistor R1 in series with the diode D, and a resistor R2 in parallel with the series combination of diode D and resistor R1. One end of resistor R2 is connected to the output node 11 and the other end is connected at 12 with control line 2" and with the earth line 2 through a capacitor C. The auxiliary line 2' includes a resistor R4 connected to the gate 6, and it includes a diode connected to the load terminal 4. A resistor R5 is connected between the drain of the transistor Q1 and the output node 7, and a resistor R6 is connected between the drain of the transistor Q4 and the output node 9. A resistor R7 is a load resistor connected across the load terminals 3 and 4.

The above-described embodiment of the oscillator according to the invention operates as follows. The potential $V_{G1}$ at the gate of the first stage inverter INV1 is zero before the circuit is energized so that the transistor Q1 of the first stage becomes conductive or ON and the other transistor Q2 remains OFF when a source current is applied from the power source $V_{DD}$ to the inverter stages through the power supply line 1. The potential $V_{G2}$ at the next gate 8 of the intermediate stage INV2 becomes equal to the drain source voltage $V_{DD}$ developed at the output node 7 of the first stage so that the transistor Q3 remains OFF but the other transistor Q4 becomes ON. Consequently, the transistor Q4 provides a conductive path to the earth line 2, and the potential $V_{G3}$ at the gate 10 of the final stage INV3 which is connected with the output node 9 becomes so close to zero that the transistor Q5 becomes ON but the other transistor Q6 remains OFF. Because of the ON or conductive state of the transistor Q5, a current from the output node 11 flows to and charges the capacitor C through the resistor R2 of the charging line. The potential $V_{G1}$ at the gate 6 rises according to the voltage increase on the capacitor C and reaches the turn ON voltage of the transistor Q2 of the first stage. The transistor Q2 then turns ON and the transistor Q1 turns OFF.

As a consequence of the transistor Q2 switching ON the potential $V_{G2}$ at the gate 8 of the intermediate stage which is connected to the output node 7 of the preceeding stage becomes zero so that the transistor Q3 turns ON and transistor Q4 turns OFF. The drain source voltage $V_{DD}$ which appears at the output node 9 is applied to the auxiliary line 2' through the connecting node 9', and is also applied to the gate 10 of the final stage so that $V_{G3}$ rises to $V_{DD}$. As a result the transistor Q6 is turned ON and the transistor Q5 is turned OFF. The discharging line including the resistor R1 and the diode D which is connected with the output node 11 operates to discharge the capacitor C through the conductive transistor Q6 and reduces to zero the gate potential $V_{G1}$ of the first stage inverter INV1. The above-described operation repeats itself and a sequence of pulses $V_{out}$ is obtained at the load terminals 3 and 4.

Figure 2:
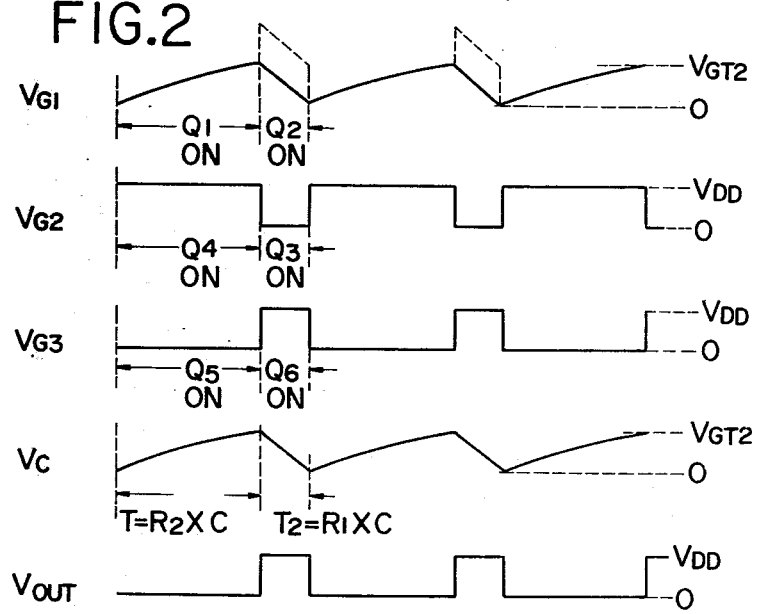
FIG. 2 is a timing chart illustrating voltage variations which occur within the oscillator circuit according to the invention during its operation.

Potentials developed during the above described operation are diagrammatically illustrated in FIG. 2. During a period when the voltage $V_C$ rises from zero upon charging the capacitor C, the gate potential $V_{G1}$ at the first stage rises from zero to the turn ON voltage $V_{GT2}$ of the transistor Q2. Within the period that the transistor Q1 is ON the transistor Q4 is also turned ON due to its gate potential $V_{DD}$ developed at the first stage's output. Consequently the transistor Q5 of the final stage is ON due to its gate potential being a zero level applied from the intermediate stage's zero level output. The conductive transistor Q5 supplies the charging current from the output node 11 of the final stage to the capacitor C through the resistor R2 of the charging line. The time T of the period during which transistors Q1, Q4 and Q5 are conductive is determined by the product of R2 × C.

The capacitor C starts its discharging period when it has been sufficiently charged to raise the gate potential of the first stage inverter INV1 above the potential $V_{GT2}$ for turning ON the transistor Q2. The time T2 of the discharging period is determined by the product of R1 × C. During this period, as the gate potential of the first stage is decreasing to zero at the first stage, the transistor Q2 is maintained ON so that the transistor Q3 is turned ON due to its gate potential maintained zero by the first stage's zero output so as to turn ON the transistor Q6 due to its gate potential maintained at $V_{DD}$ by the intermediate stage's output. Therefore, the capacitor C discharges through the discharging line including resistor R1 and the diode D through the conductive transistor Q6.

Since the capacitor C repeats the charging and discharging cycle the power supply potential $V_{DD}$ is applied as a sequence of output pulses from the transistor Q3 of the intermediate inverter INV2 through the auxiliary line 9', wherein each pulse is developed during a discharging period of the capacitor C. The duty cycle of the output pulses is determined by the charging time T and the discharging time T2, each of which are adjustable by changing the value of the resistors R2 and R1, respectively. Moreover, since the oscillating circuit has a very high input impedance at the first stage inverter INV1, the value of the resistors R1 and R2 may be selected to make the duty cycle as long as desirable. The current dissipation of the oscillating circuit is considerably reduced due to the use of the three stages of inverters INV1–INV3 having a very high impedance.

The turning-ON or turning-OFF of the respective transistor pairs Q1 and Q2, and Q3 and Q4 is likely to become unstable during a transient time when the drain current flows from the transistor Q1 to the transistor Q2; reversely from Q2 to Q1; or from the transistor Q3 to the transistor Q4; and reversely from Q4 to Q3. For the purpose of making such switching transitions sharper, the resistor R5 or R6 is preferably inserted between the transistor Q1 and the output node 7, or between the transistor Q4 and the output node 9, respectively. As the result, the transistor Q2 or Q3 is preferentially operable relative to the transistor Q1 or Q4, respectively, so that respective output pulses are shaped to exhibit a short rise time. The final stage inverter INV3 having the gate 10 which receives such a high quality pulse as is formed by the preceding two inverter stages INV1 and INV2 is caused to switch sharply and thereby supply pulses having correct time intervals or durations from the transistor Q3 of the intermediate inverter stage INV2.

Figure 3:
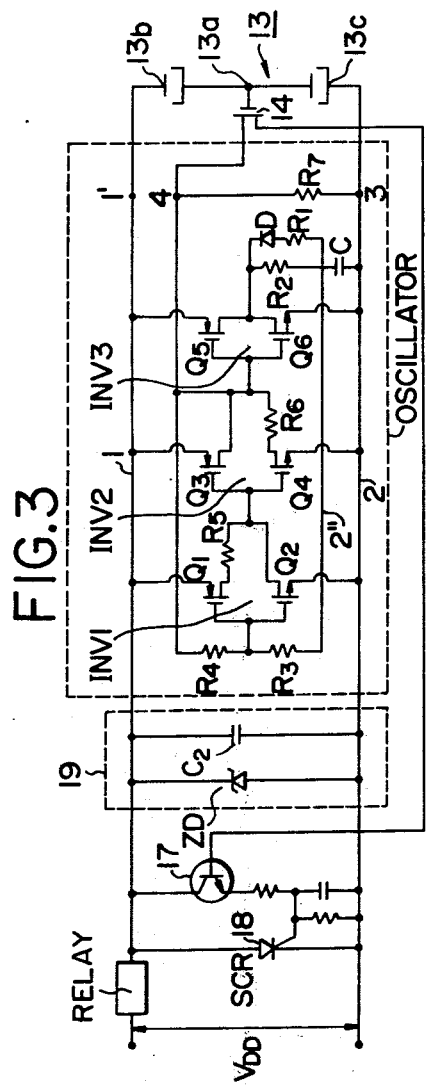
FIG. 3 illustrates the oscillator circuit according to the present invention connected with an ionization chamber smoke sensor.
Figure 4:
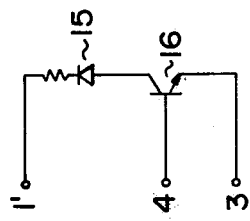
FIG. 4 illustrates a photoelectrical smoke sensor which may be used in place of the ionization chamber smoke sensor in the circuit of FIG. 3.

FIGS. 3 and 4 show the above described oscillator in conjunction with an ionization chamber smoke sensor or a photo-electrical smoke sensor. An ionization chamber smoke sensor 13, which is known in the prior art, is connected at its output port 13a to a gate of a field effect transistor 14, and the load terminal 4 of the oscillator is connected to a source of this transistor. The other load terminal 3 is connected to an inner electrode 13c of the sensor, and the power supply node 1' is connected to an outer electrode 13b. The drain of the transistor 14 is connected with a transistor 17, and a thyristor 18 triggered by the conduction of this transistor 17 is provided to make a loop with the power source $V_{DD}$. For the purpose of stabilizing the operating voltage to the oscillator, it uses a constant voltage circuit 19 comprising a zener diode ZD and a capacitor C2.

A photoelectric smoke sensor, except for a part for receiving the light emitted therefrom, is shown in the FIG. 4 and comprises a light-emitting diode 15 and a transistor 16. The input port 1' of the diode 15 is connected to the power supply node 1', the base terminal 4 of the transistor 16 is connected to the load terminal 4 of the oscillator, and the collector terminal 3 of the transistor 16 is connected to the other load terminal 3 of the oscillator. This sensor is used in place of the ionization chamber smoke sensor by making the above described connections.

When the first sensor impedance falls to a predetermined level due to any change in the ambient atmosphere, the output pulse $V_{out}$ from the oscillator renders the transistor 14 conductive and successively the transistor 17 is rendered conductive to trigger the thyristor 18. The power source $V_{DD}$ activates the relay when the circuit path from the power source and through the relay is completed by the conduction of the thyristor 18 and a fire alarm issued from an alarm device enabled by the relay.

Usual thyristors require an input duration above 100 microseconds at 25° C, and preferably 300 to 400 microseconds in order to insure triggering. Since the oscillator controls the duration T2 of the output pulse $V_{out}$ according to the product R1 and C, the input duration requirements of usual thyristors can be satisfied certainly with the pulses generated from the oscillator by selecting an appropriate output pulse duration. As the pulse interval T is also determined by the product of R2 and C, the current dissipation can be reduced to as low a value as possible in accordance with the accuracy requirements of the detecting function performed by a particular fire sensor.

When the light-emitting diode 15 is used, light is emitted during the pulse length T2 when a pulse is applied to the base of the transistor 16 thereby to detect any change of combustion substances contained in the ambient atmosphere. The period of existence of the light is changed by modifying the above mentioned RC products.

For the usual case when the number of fire sensors on a single detecting circuit is greater than twenty, it is very advantageous to make the current dissipation as small as possible. For example, a current was measured at a circuit having electrical elements with the values shown in parenthesis in the FIG. 1 by inserting an ammeter at the point M. As a result, 33.1 microamps was measured. The same circuit from which both resistors R5 and R6 were removed required 21.6 milliamps. Thus, resistors R5 and R6 considerably reduce the current dissipation, as shown by the above comparison by a factor of 1/1,500. Other examples of current measurements for other values of R5 and R6 are set forth in the following table. It is additionally noted that inverters INV1=INV3 used were RCA C-MOS 4007 having an internal resistance of 300 ohms in the conductive state.

TABLE

| | R5(ohm) | R6(ohm) | Electric Current (mA) |
|---|---|---|---|
| 1. | 0K | 0K | 21.6 |
| 2. | 1K | 1K | 1.30 |
| 3. | 10K | 1K | 0.140 |
| 4. | 100K | 1K | 0.0260 |
| 5. | 470K | 10K | 0.0331 |
| 6. | 1000K | 1K | 0.0130 |
| 7. | 1000K | 10K | 0.0026 |

From the measurements set forth in the table it is apparent that the resistor R5 ranging in value from 1 Kohm to 1000 Kohms may easily reduce the current dissipation by factors from 1/20 to 1/1,500. The oscillator according to the invention which has been developed as a power supply for use with prior art fire sensors is able to power a network including a larger number of fire sensors than prior art systems. In addition, this oscillator which permits change of the duty cycle or pulse duration or interpulse interval of the pulses generated therefrom may prevent a fire detection system from issuing a false alarm because the possibility of applying such pulses to the sensor when any cause, except a fire, affects the sensor is substantially less due to the very short pulse durations possible.

We claim:

1. An oscillator circuit, comprising:
   first, second and third bistable circuits each having a pair of stable operating states and each having a respective input port for receiving input signals and a respective output port for developing output signals thereat, said bistable circuits being responsive to input signals applied to their respective input ports for operating in states determined by said input signals and for developing respective output signals having values according to the states said bistable circuits are operating in;
   connecting means connecting said bistable circuits is cascade in the named order so that a change of state of said first bistable circuit will effectuate successive changes of state of said second and said third bistable circuit, whereby the output signal of said third bistable circuit is representative of the state of said first bistable circuit;

first timing means connected to the output port of said third bistable circuit to recieve the output signals developed thereat for developing a first timing signal effective to change the state of said first bistable circuit from a first state to a second state thereof after a first time interval has elapsed after said third bistable circuit has changed from a state corresponding to the second state of said first bistable circuit to a state corresponding to the first state of said first bistable circuit and for applying said first timing signal to the input port of said first bistable circuit; and second timing means connected to the output port of said third bistable circuit to receive the output signals developed thereat for developing a second timing signal effective to change the state of said first bistable circuit from the second state to the first state thereof after a second time interval has elapsed after said third bistable circuit has changed from a state corresponding to the first state of said first bistable circuit to a state corresponding to the second state of said first bistable circuit and for applying said second timing signal to the input port of said first bistable circuit, whereby the states of said bistable circuits oscillate between their respective stable operating states with a period equal to the sum of said first time interval and second time interval.

2. An oscillator circuit according to claim 1, wherein:

each of said bistable circuits comprise a complementary pair of field effect transistors with respective channels of complementary conductivity type having their respective gates connected together to define an input port for the pair and having their respective drains connected together to define an output port for the pair; and said connecting means comprises a power supply line connected to the source of each transistor of said complementary transistor pairs having a first channel conductivity type, an earth line connected to the source of each transistor of said complementary transistor pairs having a second channel conductivity type opposite the first channel conductivity type, means connecting the output port of said first pair to the input port of said second pair, and means connecting the output port of said second pair to the input port of said third pair.

3. An oscillator circuit according to claim 1, wherein:

said first timing means comprises a first resistor and a capacitor connected in series between the output port of said third bistable circuit and an earth line for charging said capacitor with an output signal of said third bistable circuit, and means for applying a voltage stored in said capacitor to apply an increasing capacitor voltage as the first timing signal to the input port of said first bistable circuit; and said second timing means comprises a second resistor and a diode connected in series across said first resistor with said diode having a polarity effective to define a discharge path for the voltage stored in said capacitor, and said means for applying the voltage stored in said capacitor to apply a decreasing voltage as the second timing signal to the input port of said first bistable circuit.

4. An oscillator circuit according to claim 1, wherein said connecting means includes a resistor connected between the output port of said first bistable circuit and the input port of said second bistable circuit.

5. An oscillator circuit according to claim 1, wherein said connecting means includes a resistor connected between the output port of said second bistable circuit and the input port of said third bistable circuit.

6. An oscillator circuit comprising:

three pairs of complementary field effect transistors each comprising a first field effect transistor having a channel of a first conductivity type and a second field effect transistor having a channel of a second conductivity type, wherein the first and second transistor of each pair of complementary field effect transistors have their respective gates connected together to define a gate node for the pair and have their respective drains connected together to define an output node for the pair, and wherein said three complementary transistor pairs are connected in cascade with the output node of a first pair connected to the gate node of a second pair and with the output node of the second pair connected to the gate node of a third pair;

a power supply line connected to the source of each first transistor of said three complementary transistor pairs having the first channel conductivity type;

an earth line connected to the source of each second transistor of said three complementary transistor pairs having a second channel conductivity type; and a charging and discharging loop comprising a capacitor connected between the gate node of the first transistor pair and said earth line for developing a potential to bias the gates of the first pair of transistors, a first resistor connected between the output node of the third transistor pair and said capacitor to define a charging path to charge said capacitor when the first transistor of the third complementary pair is conductive, a series combination of a second resistor and a diode connected between the output node of the third pair and second capacitor and with said diode having a polarity to define a discharge said capacitor through the second transistor of the third complementary pair; wherein said capacitor is charged through the first transistor of the third pair until it is sufficiently charged to switch the respective conductive states of said first transistor pair and whereby successively switch the respective conductive states of said second and third transistor pairs to discharge said capacitor until the respective conductive states of said first pair are again switched, whereby the switching of the conductive states of the respective transistor pairs is repetitive.

7. An oscillator circuit according to claim 6 further comprising a resistor connected between the output node of said first pair and the gate node of said second pair.

8. An oscillator circuit according to claim 6 further comprising a resistor connected between the output node of said second pair and the gate node of said third pair.

* * * * *